United States Patent [19]
Mansfield et al.

[11] Patent Number: 5,336,999
[45] Date of Patent: Aug. 9, 1994

[54] ECHO PLANAR IMAGING USING 180 DEGREES PULSES

[75] Inventors: Peter Mansfield; David N. Guilfoyle, both of Nottingham, England; Roger J. Ordidge, Detroit, Mich.

[73] Assignee: British Technology Group Limited, London, England

[21] Appl. No.: 828,902

[22] Filed: Mar. 6, 1992

[30] Foreign Application Priority Data

Aug. 8, 1989 [GB] United Kingdom ............... 8918105.1

[51] Int. Cl.⁵ ............................................. G01R 33/20
[52] U.S. Cl. ..................................................... 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,684,891 | 8/1987 | Feinberg | 324/309 |
| 4,740,748 | 4/1988 | Rzedzian | 324/309 |
| 4,993,075 | 2/1991 | Sekihara et al. | 324/307 |
| 5,084,675 | 1/1992 | Reinfelder et al. | 324/309 |

FOREIGN PATENT DOCUMENTS

| | | |
|---|---|---|
| 0175184 | 3/1986 | European Pat. Off. . |
| 0240319 | 10/1987 | European Pat. Off. . |
| 0349976 | 1/1990 | European Pat. Off. . |
| 580787 | 12/1980 | United Kingdom . |
| 139764 | 11/1984 | United Kingdom . |
| 256779 | 2/1988 | United Kingdom . |
| 286677 | 10/1988 | United Kingdom . |

OTHER PUBLICATIONS

Magnetic Resonance in Medicine, vol. 8, No. 1, Sep. 1988, Academic Press, Inc., (Duluth, Minn., US), R. J. Ordidge et al. Snapshot head imaging at 0.5 T using the pp. 110–115.

Magnetic Resonance in Medicine, vol. 5, No. 5, Nov. 1987, Academic Press, Inc., (Duluth, Minn., US), K. Sekihara et al. "Now reconstruction technique for echo-planar imaging to allow combined use of odd and even numbered echoes", pp. 485–491.

Primary Examiner—Michael J. Tokar
Attorney, Agent, or Firm—Cushman, Darby & Cushman

[57] ABSTRACT

A magnetic resonant image of an object is produced by subjecting the object to an initial slice selection to provide an active region and by subjecting the active region to a plurality of 180° RF pulses and appropriate amplitude modulated x and y gradients.

5 Claims, 7 Drawing Sheets

ECHO PLANAR IMAGING USING 180 DEGREES PULSES

The present invention relates to echo-planar imaging systems and more particularly to methods and apparatus for obtaining images of specimens which have inherently short spin-spin relaxation times due to inhomogeneous broadening arising from bulk susceptibility of the system, static magnetic field broadening, or other induced static broadening.

Echo-planar imaging (EPI) is an ultra high-speed imaging technique capable of producing snap-shot cross-sectional images of an object in "exposure times" ranging from typically 10-100 ms. The technique has been applied successfully in a range of clinical studies and is especially valuable in parts of the anatomy where there is considerable involuntary motion. EPI is also capable of capturing a series of images in the form of a movie sequence. Such movies have been demonstrated at up to 20 frames a second producing genuine real-time imaging. One of the difficulties with EPI as it is currently practiced is the severe demands required of the main static magnetic field in terms of its homogeneity. Another difficulty is the very large switched gradients that are commonly used and the short switching times. These problems are, of course, overcome allowing current EPI results to be obtained. However, in non-medical situations there is a range of potentially useful applications involving specimens which have inherently short spin-spin relaxation times due to induced local field inhomogeneity arising from the bulk susceptibility of the system. We are here thinking of rock, earth and sand samples, for example. But the problem of local induced inhomogeneity also manifests itself in other relatively homogeneously distributed samples at very high magnetic field strengths. In these circumstances the difficulty arises at an interface within the specimen where the density, and hence the magnetic susceptibility of the material, changes significantly.

The effect of local induced inhomogeneity is to shorten the effective transverse relaxation time $T_2^*$. This in turn limits the total time that the NMR signal may be effectively sampled. In EPI this means that ultimately the image spatial resolution is compromised.

It is well-known that NMR spin echoes produced by application of a 180° radio frequency pulse rather than a gradient reversal are able to effectively remove local inhomogeneity effects by recalling the apparently lost signal in the form of a spin echo. Indeed in the original papers on EPI (P. Mansfield, J. Phys. C. 10, L55 (1977), P. Mansfield and I. L. Pykett, J. Mag. Res. 29, 355 (1978), P. Mansfield and P. G. Morris), NMR Imaging in Biomedicine, Academic Presse, New York, 1982, A. Howseman et al, Brit. J. Radiol. 61, 822 (1988), 180° pulses were mentioned as an alternative to gradient reversal. Such an arrangement has not so far been pursued in medical imaging because the use of many radio frequency pulses could result in an unacceptably high RF power deposition in the patient while being imaged. This is especially true at high frequencies.

RF power deposition is, generally speaking, no problem when imaging non-biological systems like geological samples. Since it is this type of material that produces the worst induced inhomogeneity effects, it seemed appropriate to reconsider variations of EPI which use radio frequency pulses instead of gradient reversal where appropriate.

One object of the present invention is to provide methods of producing an image of a geological or similar sample.

A further object is to provide a means of producing a medical image in cases where there is substantial induced local inhomogeneity, e.g. bone and air interfaces, and also in cases where magnetic contrast agents are used such as encapsulated ferrous materials, etc. which can cause severe degradation of image quality.

The present invention provides a method of producing a magnetic resonance image of an object by an echo planar imaging process in which the object is subjected to an initial slice selection procedure to define an active region of spin magnetisation, characterised in that the active region, during a data acquisition period, is further subjected to a plurality of transverse spin inversion 180° RF pulses, an amplitude modulated x gradient $G_x$ and an amplitude modulated y gradient $G_y$ in the form of short duration blips to produce an echo planar image of the object.

Embodiments of the present invention will now be described, by way of example with reference to the accompanying drawings in which:

FIG. 1(b) shows a pulse timing diagram for the BEST and EPI (dotted) sequences corresponding to FIG. 1a;

A number of variants of EPI are considered ranging from the case when all gradient switches are replaced by 180° pulses, useful for imaging non-biological systems, to the case where occasional 180° pulses are used interspersed in applications where the main RF power deposition must be kept to an acceptable level.

Figure 1A:
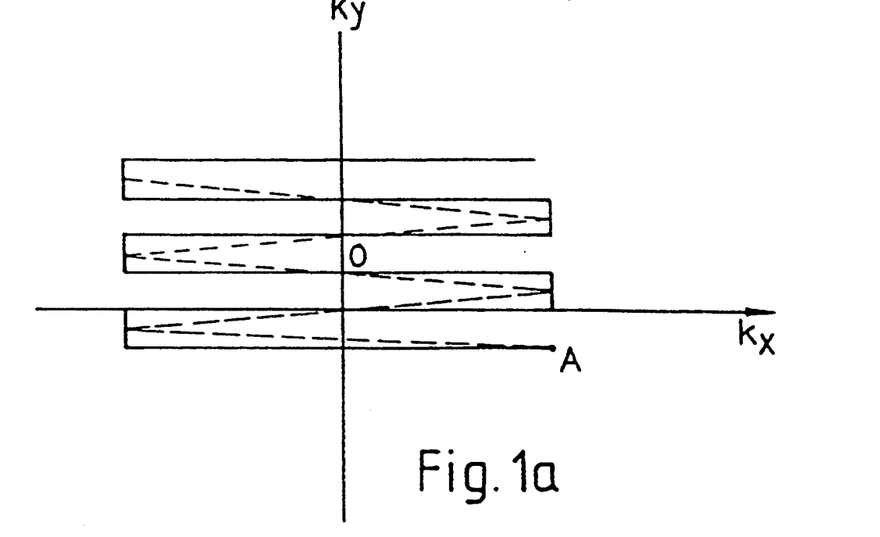
FIG. 1(a) shows a k-plane trajectory for blipped echo-planar imaging (BEPI or BEST) (solid line) and standard EPI (dotted)
Figure 1B:
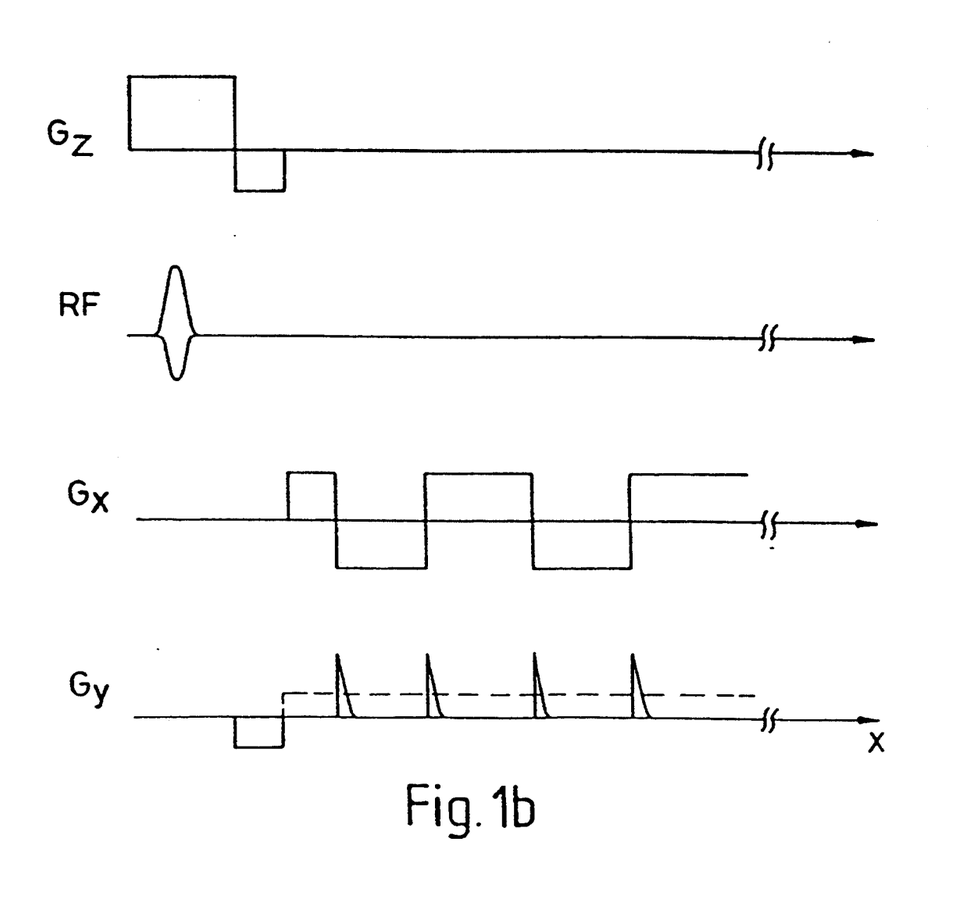

In considering and understanding EPI it is convenient to view the image process from the standpoint of reciprocal lattice space or k-space rather than imaging space or real space. Since we are discussing a two-dimensional imaging technique we consider the k-plane with axes $k_x$ and $k_y$ as illustrated in FIG. 1a. In gradient reversed EPI k-space is traversed as indicated by the solid line in the so-called blipped echo-planar single-pulse technique (BEST). The k-space trajectory is effectively a one pass process starting at the origin O and then proceeding to point A in the lower half plane where the uniform k-space scanning process is continued to cover the whole plane. The pulse timing diagram for this scanning procedure is illustrated in FIG. 1b. Following the initial slice selection as indicated, the k-space scanning process is achieved by modulating the x-gradient in a trapezoidal (ideally rectangular) waveform. This moves the sampling point in k-space successively along the x-axis. To produce a raster scan of the whole of k-space short $G_y$ blips of gradient of constant amplitude are applied as indicated which forces the k-trajectory incrementally upwards to give a uniform coverage of the k-plane. An alternative scanning strategy is indicated in FIG. 1a (dotted line) and in this case instead of using blips of y-gradient, $G_y$ is kept on constantly as indicated by the dotted line in FIG. 1b.

Figure 2A:
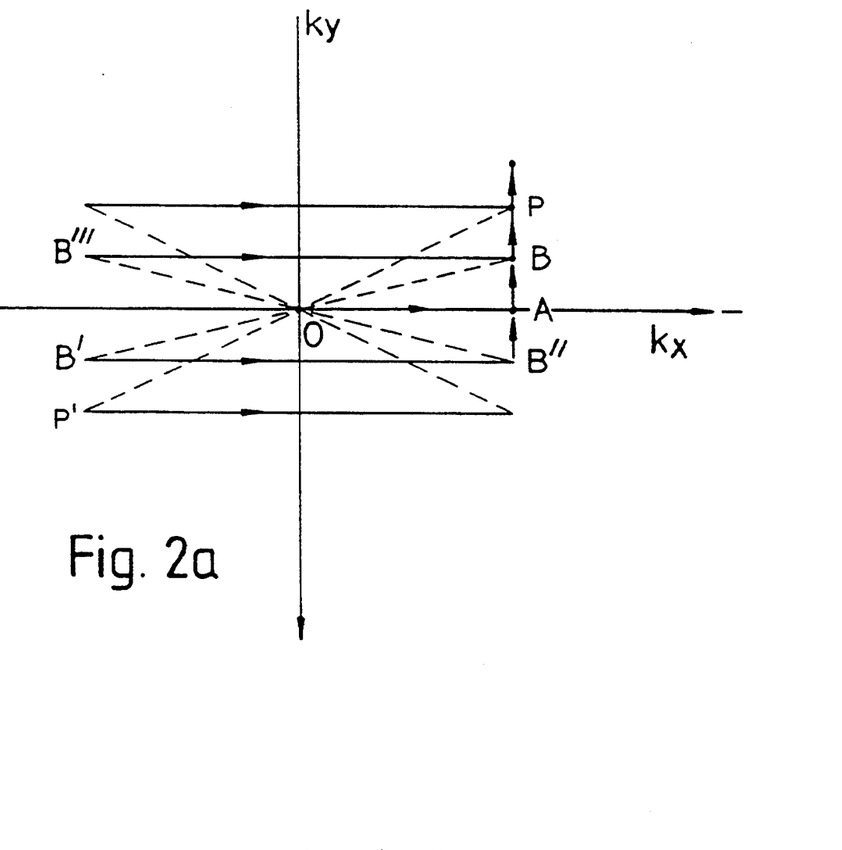
FIG. 2(a) shows a modified EPI sequence using 180° RF pulses (TSI-EPI) (Transverse Spin Inversion-EPI)
Figure 2B:
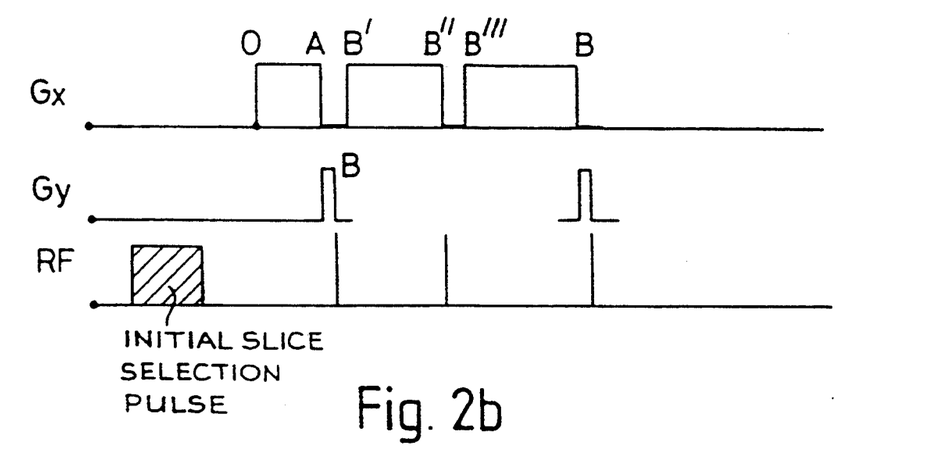
FIG. 2(b) shows a k-plane scanning diagram for TSI-EPI.

In the present invention the bipolar x-gradient of FIG. 1b is replaced by a unipolar $G_x$ gradient and 180° RF spin inversion (SI) pulses. The modified k scan and sequence (TSI-EPI) are sketched in FIG. 2. It is noticed that in order to accommodate the 180° RF pulses it is necessary to switch off the x-gradient momentarily (FIG. 2b). In the version described here y blips are added as indicated. The traversal of k-space in this instance occurs in a slightly different sequence to the MBEST experiment. FIG. 2a shows the k-space scanning diagram and is illustrated by the first few traversals. It is pointed out that the effect of the 180° pulse applied during the sequence at some point P with position coordinates $k_x$, $k_y$, is to move to a conjugate point P' with coordinates $-k_x$ and $-k_y$. As indicated this means that to scan the upper and lower half planes of k-space in a regular manner requires one $G_y$ blip for every two RF pulses.

From the discussion hereinbefore it will be readily seen that there are a number of possibilities for using 180° pulses ranging from none in the case of standard BEST or MBEST imaging through to the case as described in FIG. 2 where the maximum number of 180° pulses is used corresponding to every x-gradient transition in the equivalent experiment. Using the maximum number of RF pulses may in certain circumstances, especially in medical imaging, create problems with excessive power deposition in the patient. In order to remove sample and magnet inhomogeneity effects it is, in general, only necessary to use occasional 180° pulses. We, therefore, propose a variation of the above sequence in which k-space is appropriately covered with combinations of gradient switching and occasional 180° pulses.

Figure 3A:
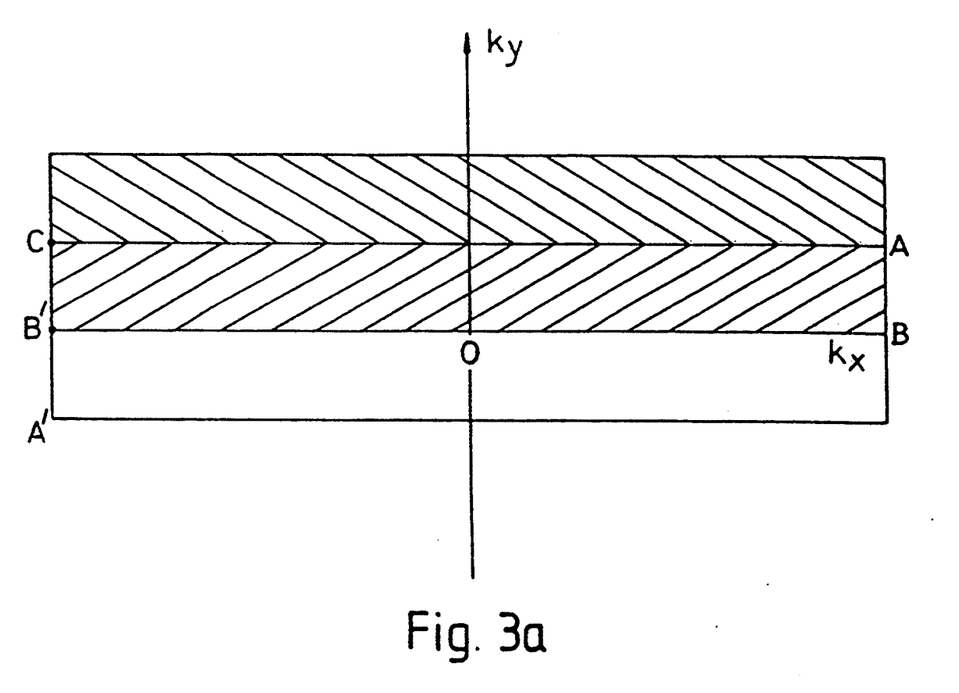
FIG. 3(a) shows a generalised hybrid k-plane scan covering the full k-plane. (This uses blocks of gradient switching (hatched) with occasional 180° RF pulses.)

As an example we consider the k-space diagram of FIG. 3a. The k-space coverage is considered in blocks (hatched) as depicted. The first set of M gradient reversals take the k-space trajectory from 0 to point A. A 180° pulse then takes the trajectory to the conjugate point A' when the next set of gradient reversals take the trajectory to B. The 180° pulse again conjugates this to B' and then M blips of $G_y$ gradient are required prior to the next set of gradient reversals taking the k-space trajectory to point C, etc.

Figure 3B:
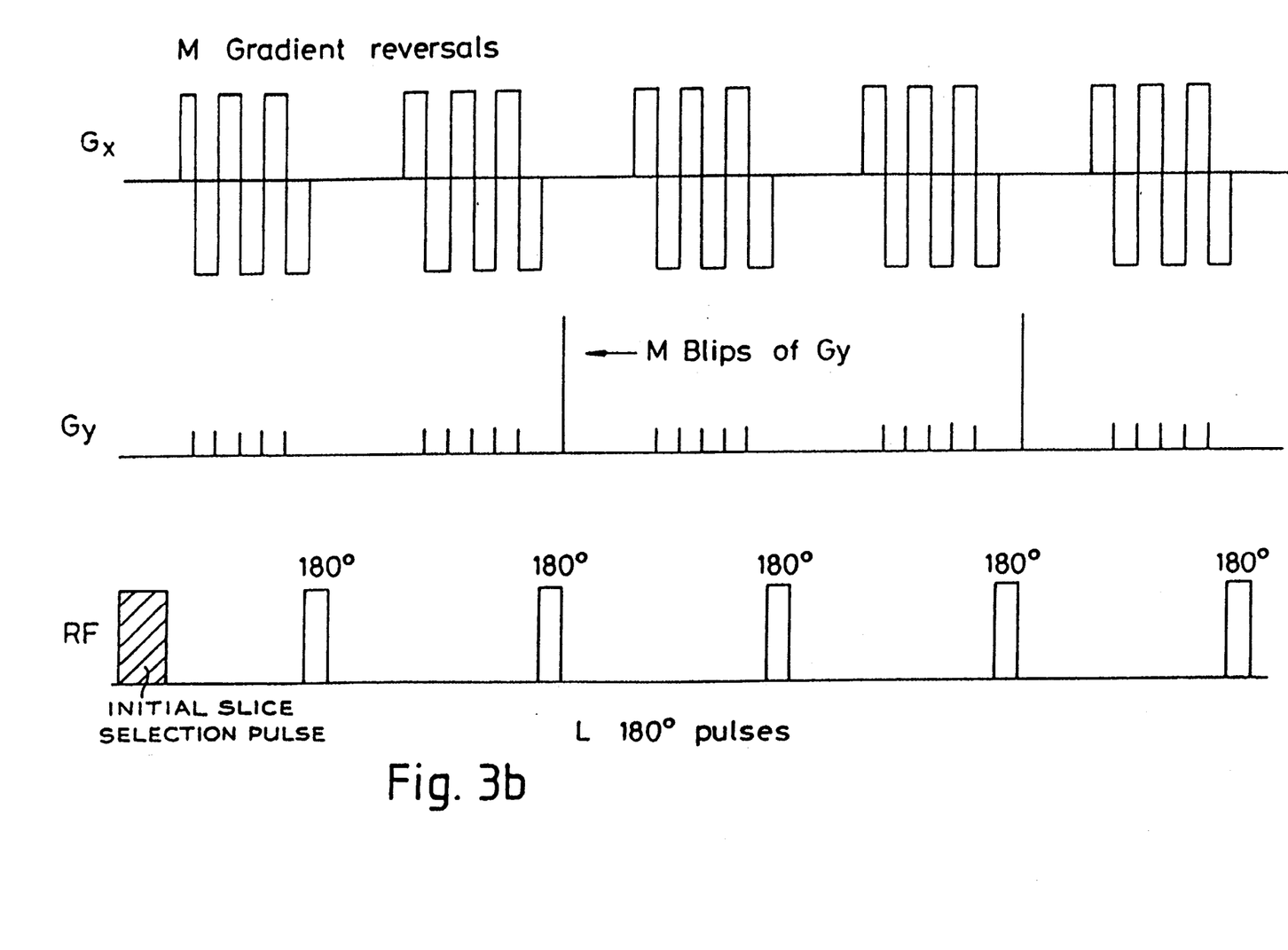
FIG. 3(b) shows a generalised pulse timing diagram to achieve the coverage of k-space depicted in FIG. 3(a)

FIG. 3b shows the generalised pulse timing diagram (an extension of that depicted in FIG. 2b), combining gradient reversals with 180° pulses. If N echoes are required in the final image, then this is made up from M gradient reversals with L 180° pulses where $L=[(N/M)-1]$. The total number of echoes is given by $N=ML$. After each alternate 180° pulse M blips of $G_y$ gradient are required.

Figure 4A:
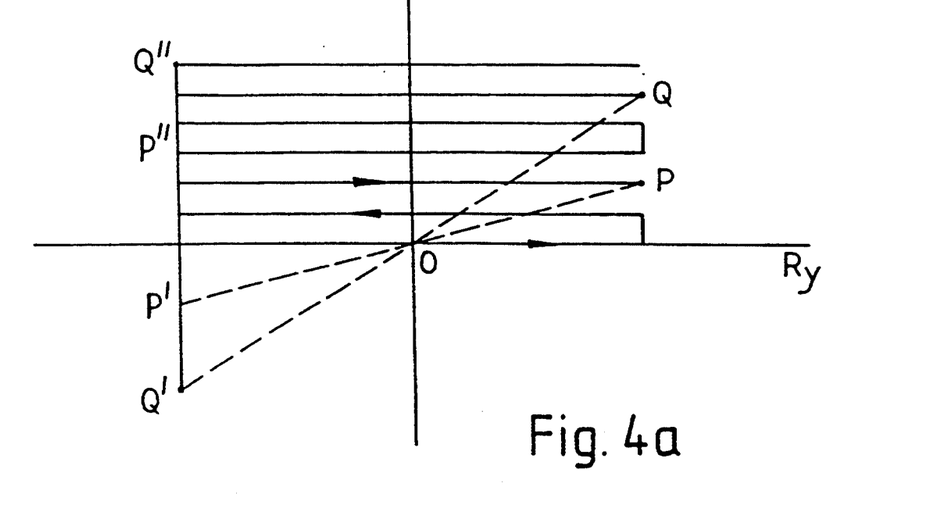
FIG. 4(a) shows a hybrid k-plane scan (upper half plane only)
Figure 4B:
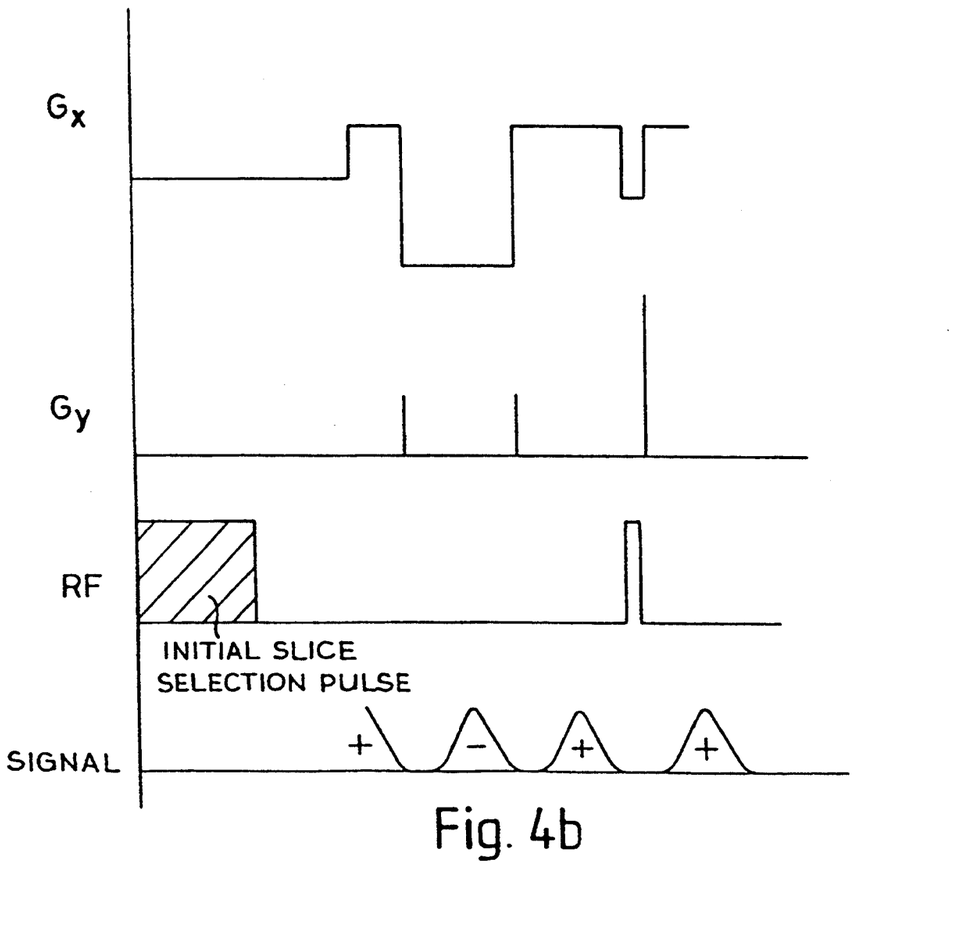
FIG. 4(b) shows a timing diagram for a hybrid scheme using variable amplitude blips.

An alternative version in which only the upper half plane is scanned is shown in FIG. 4a. Scanning proceeds from the origin O to point P by gradient switching and uniform amplitude $G_y$ blips. Let us say that, for example, ⅛th of the total scan is completed by the point P. A 180° pulse is then applied taking the scan to the conjugate point P' in the lower half plane. A larger blip is then applied taking the trajectory to P". Evolution in k-space then occurs to point Q at which point a 180° pulse is applied taking the scan to the lower half plane at point Q' where an even larger blip is applied taking the scan to Q". Further 180° pulses and larger or longer blips are applied at appropriate points in the trajectory. The pulse timing diagram for this sequence is shown in FIG. 4b.

Figure 5A:
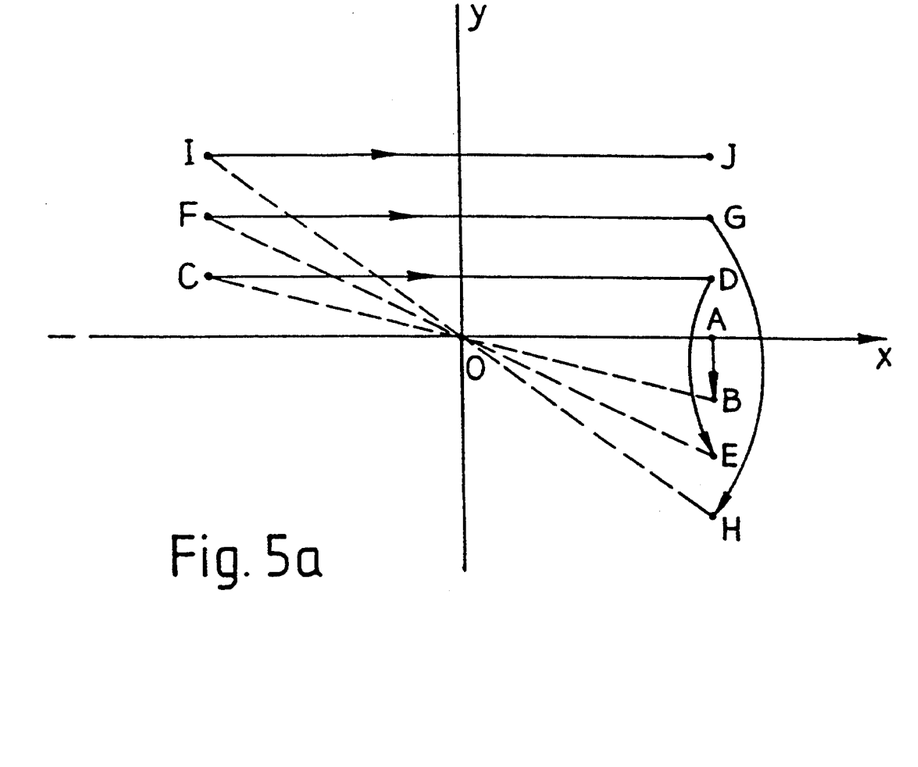
FIG. 5(a) shows the k-space coverage for a sequence using RF pulses and variable amplitude $G_y$ blips.
Figure 5B:
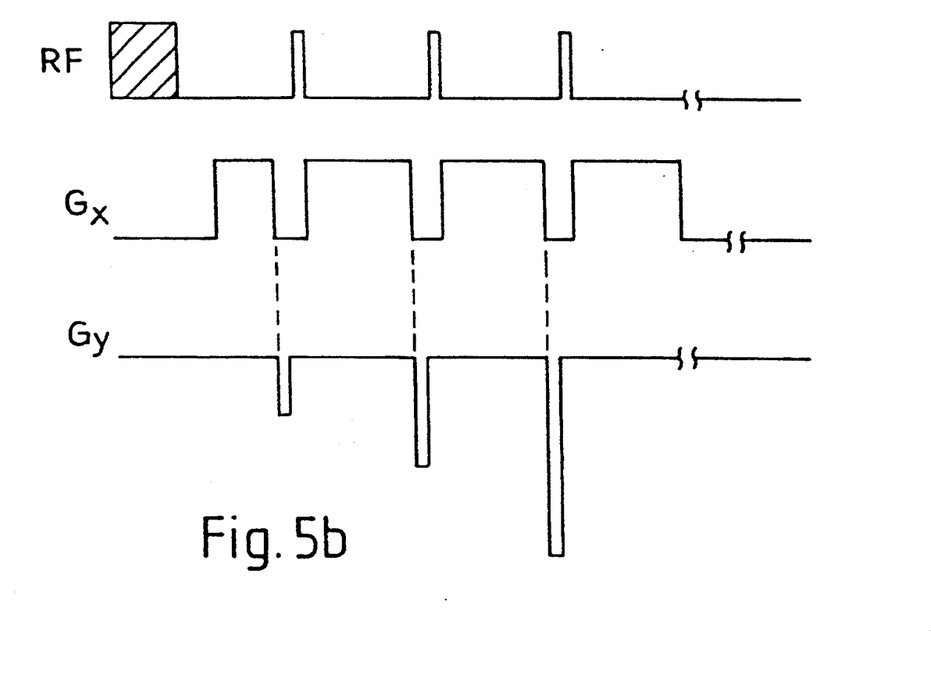
FIG. 5(b) shows a pulse timing diagram for the k-space coverage depicted in FIG. 5(a). (N.B. as sketched only upper half plane scanned)

Other variations of the k-space scanning procedure are possible which combine blipped gradients of varying amplitude with 180° pulses. An example of this class of k-space scan is indicated in the k-trajectory diagram of FIG. 5a. The k-trajectory follows the path OABC . . . J . . . In this sequence as shown, only half of the k-plane is scanned. However, it may be readily modified to provide full plane coverage. In order to achieve this particular version it is necessary to use $G_y$ blips which vary in amplitude as indicated in the pulse timing diagram of FIG. 5b. Note that in this case there is a $G_y$ blip of increased amplitude for each RF pulse.

In a further variation, two experiments are performed with a 180° reversal of the carrier phase of either the initial 90° selection pulse or the train of 180° RF pulses in the second experiment. The two time signals from each experiment are co-added with the advantage that unwanted signals generated immediately after the 180° pulses (due to instrumental imperfections) are cancelled whereas the required spin echo signals add constructively.

In a further alternative the 180° RF pulses may be slice selective or may be composite pulses consisting of a sequence of short rectangular pulses of given amplitude and inter-pulse delay, designed to optimise the inversion of signal over a broad frequency band width.

As an initial illustration of TSI-EPI we have implemented the sequence described in FIG. 2b. The object comprised two coaxial glass cylinders, the outer diameter of which was 50 mm. The annulus space was filled with glass beads of mean diameter 3 mm. The inner cylinder was filled with smaller glass beads of mean diameter 350 μm. The interstitial space around the beads in both compartments was filled with water. This arrangement caused the transverse relaxation time T2 of the water to decrease from 500 ms to 20 ms thus indicating a substantial induced local magnetic field inhomogeneity due to the bulk susceptibility difference between glass and water.

Sixty four 180° RF pulses were used each with duration of 248 μs. The interpulse spacing was 1.5 ms making a total experimental time (excluding initial slice selection) of 176 ms. The x-gradient magnitude was 2.4 mT/m while the y-gradient blips had a peak value of 0.15 mT/m. The 64 spin echoes produced were suitably recorded effectively in the upper and lower half k plane as indicated in FIG. 2a. In practice this corresponds to temporal reordering of successive echoes in the sequence from 1,2,3, . . . to 4,2,1,3, . . . When done this way a single one dimensional Fourier transform of the data yields the spin density distribution of the selected slice in the form of a broad profile the sections of which may be formed into the desired image cross-section. N.B. The initial free induction decay is not used in this example.

Figure 6A:
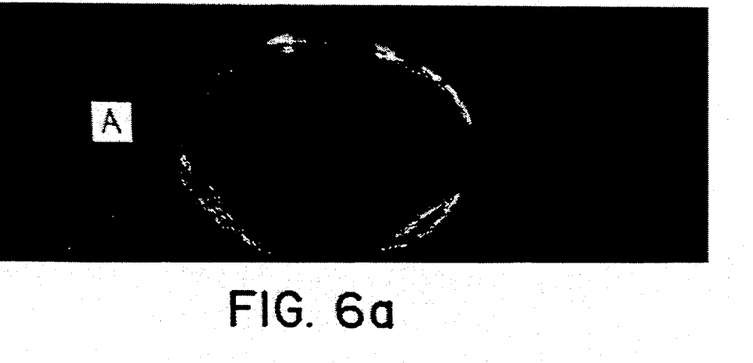
FIGS. 6a and 6b show an image of a water filled phantom containing glass beads, FIG. 6a imaged by standard EPI and FIG. 6b imaged by using the modified TSI-EPI method. (The inner core shows darker and is made up of small beads. The graininess in the outer annulus of this image is due to the larger bead size which is close to the image resolution of the system.) The two white zones correspond to water ridges.
Figure 6B:
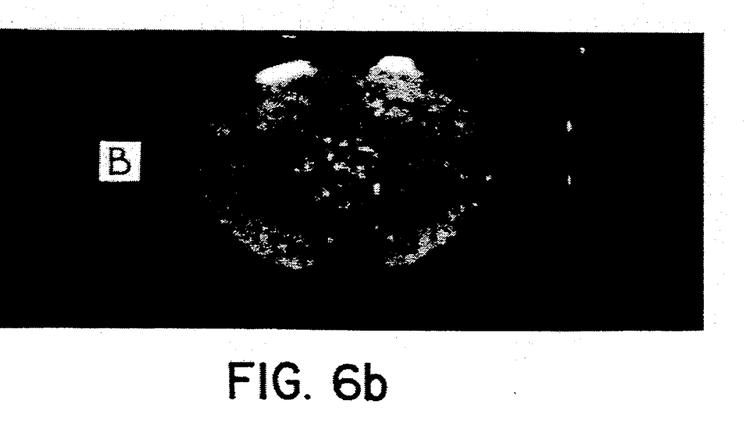

FIG. 6b shows the TSI-EPI image obtained which is clearly defined. The spatial resolution of this is 1.5 mm along both axes. The slice thickness was 10 mm. The difference between the central core and surrounding annulus can be made out in this snap-shot image. Variations in the bead distribution cause some signal variation with the image. With the in-plane resolution quoted, the small beads themselves are beyond resolution. But in any event, partial volume effects due to the relatively thick slice used preclude clear resolution of the larger spherical beads. N.B. The two bright spots at the top of the image correspond to water ridges where the beads fail to completely fill the outer vessel.

In stark contrast to the above image, FIG. 6a shows an MBEST image of the same object. Only the water ridges and a faint outline of the object can be discerned. The much lower image clarity is directly ascribable to the signal loss due to the shortened T2. The short T2 also broadens the pixel point spread function, thereby vitiating the spatial resolution.

The invention demonstrates that EPI is a viable imaging technique for the study of geological specimens when used in combination with 180° RF pulses. Without the RF pulses signal loss due to induced local inhomogeneities makes some standard forms of EPI unviable with these samples. The BEST technique (not exemplified herein), should give a brighter signal, but wall still suffer point spread function blurring.

The problem of induced local inhomogeneity exists to a lesser extent in medical imaging. Nevertheless, some benefit would accrue if occasional 180° RF were interspersed within an EPI sequence employing periodically switched gradients. From the patient viewpoint, occasional RF pulses need not constitute a hazard in terms of mean power deposition. Some examples of this hybrid approach have been described.

We claim:

1. A method of producing a magnetic resonance image of an object by an echo planar imaging process in which the object is subjected to an initial slice selection procedure to define an active region of spin magnetisation, characterised in that the active region, during a data acquisition period, is further subjected to
   a) a plurality of transverse spin inversion 180° RF pulses,
   b) an amplitude modulated x gradient $G_x$, and
   c) an amplitude modulated y gradient $G_y$ in the form of short duration unipolar blips to produce an echo planar image of the object.

2. A method of producing a magnetic resonance image as claimed in claim 1 comprising the steps of:
   (a) applying a first RF initial selection pulse in combination with an appropriate selection gradient pulse;
   (b) applying a unipolar $G_x$ gradient;
   (c) applying a series of blipped y gradient pulses $G_y$ each $G_y$ blipped pulse being spaced apart from the next by a first predetermined time interval;
   (d) applying a plurality of transverse spin inversion 180° RF pulses each pulse being spaced from the next by a second predetermined time interval the second predetermined time interval being equal to one half of the first predetermined time interval;
   (e) switching off the unipolar x gradient ($G_x$) during a time interval sufficient to encompass the time interval of each spin inversion 180° RF pulse and the time interval of each blipped $G_y$ pulse; and
   (f) receiving and sampling the NMR signals from the object after each spin inversion 180° RF pulse and generating an NMR image of the object from the received and sampled NMR signals.

3. A method of producing a magnetic resonance image as claimed in claim 1 comprising the steps of:
   (a) applying a first RF initial selection pulse; combination with an appropriate selection gradient pulse;
   (b) applying a plurality of series of x gradient pulses $G_x$ at predetermined first intervals each series of pulses comprising M gradient reversals;
   (c) applying a plurality of series of y gradient pulses at predetermined intervals comprising M blips of $G_y$ gradient;
   (d) applying a plurality of transverse spin inversion 180° RF pulses, each 180° RF pulse being applied at a time following each series of M gradient reversals of the x gradient $G_x$; and
   (e) receiving and sampling the NMR signals from the object after each spin inversion 180° RF pulse and generating an NMR image of the object from the received and sampled NMR signals.

4. A method of producing a magnetic resonance image as claimed in claim 1 comprising the steps of:
   (a) applying a first RF initial selection pulse; combination with an appropriate selection gradient pulse;
   (b) applying an amplitude modulated x gradient ($G_x$);
   (c) applying a plurality of y gradient blips of a first magnitude;
   (d) applying a plurality of transverse spin inversion 180° RF pulses;
   (e) applying further y gradient blips of different magnitude from the first magnitude; and
   (f) receiving and sampling the NMR signals for the object after each transverse spin inversion 180° RF pulse and generating an NMR image of the object for the received and sampled NMR signals.

5. A method of producing an NMR image of an object as claimed in claim 1 comprising the steps of:
   (a) applying a first RF initial selection pulse in combination with an appropriate selection gradient pulse.
   (b) applying an amplitude modulated x gradient ($G_x$);
   (c) applying a plurality of y gradient blips ($G_y$) at predetermined intervals in which each y gradient blip in said plurality is larger than the preceding blip;
   (e) applying a plurality of transverse spin inversion 180° RF pulses, each 180° RF pulse being applied at a time interval following each y gradient blip; and
   (f) receiving and sampling the NMR signals from the object after each 180° RF pulse and generating an NMR image of the object from the received and sampled NMR signals.

* * * * *